United States Patent [19]
Bhagwan

[11] Patent Number: 5,864,572
[45] Date of Patent: Jan. 26, 1999

[54] OSCILLATOR RUNAWAY DETECT AND RESET CIRCUIT FOR PLL CLOCK GENERATOR

[75] Inventor: Raghunand Bhagwan, Sunnyvale, Calif.

[73] Assignee: Sun Microsystems, Inc., Mountain View, Calif.

[21] Appl. No.: 702,974

[22] Filed: Aug. 26, 1996

[51] Int. Cl.$^6$ .................................................. G06F 11/00
[52] U.S. Cl. .............................. 371/62; 371/48; 371/47.1
[58] Field of Search ........................... 371/62, 47.1, 48.1, 371/5.4; 331/15; 327/3

[56] References Cited

U.S. PATENT DOCUMENTS 5,220,293  6/1993  Rogers ....................................... 331/15
5,371,425  12/1994  Rogers ......................................... 327/3

*Primary Examiner*—Phung M. Chung
*Attorney, Agent, or Firm*—Robert Platt Bell & Associates, P.C.

[57] ABSTRACT

An oscillator runaway detection circuit is provided with a synchronous delay line such that energy saving or sleep modes of operation are not mischaracterized as oscillator runaway. A Schmitt trigger monitors oscillator control voltage at a filter capacitor. If the control voltage is below a predetermined limit, indicating a possible runaway condition, a signal is output to a synchronous delay line. The output of the Schmitt trigger is propagated through the synchronous delay line comprising a plurality of flip-flops clocked by the system reference clock. The output of the synchronous delay line drives a transistor which in turn may charge the filter capacitor to reduce the control voltage and thus lower the frequency of the oscillator. A one-shot coupled to the clock tree monitors for clock activity in the clock tree. If clock activity is present, it is presumed that a runaway condition does not exist, and the output of the one-shot resets the flip-flops in the delay line, preventing the output of the Schmitt trigger to charge/reset the oscillator.

16 Claims, 3 Drawing Sheets

OSCILLATOR RUNAWAY DETECT AND RESET CIRCUIT FOR PLL CLOCK GENERATOR

FIELD OF THE INVENTION

The present invention relates generally to a Voltage Controlled Oscillator (VCO) for used with a Phase Locked Loop (PLL) for an on-chip clock generator. In particular, the present invention is directed towards an improved PLL with a runaway detect and reset feature.

BACKGROUND OF THE INVENTION

When using a PLL as an on-chip clock generator, the PLL may be required to lock to a system reference clock at power-on and also acquire lock after clock stop. Due to limitations in the feedback path of the PLL (i.e., the clock distribution tree), it might be possible that the PLL will not lock under certain initial conditions of the filter capacitor (i.e., VCO controlling voltage). This initial condition corresponds to the maximum operating frequency of the VCO. For example, in some prior art PLL circuits, the initial value of the filter capacitor may be the supply voltage Vdd or in others, the system ground. Under such circumstances, the PLL is said to have "runaway" to a maximum operating frequency FIG. 1 is a block diagram illustrating a prior art PLL circuit 100. PLL circuit 100 may use as a local oscillator a voltage or current controlled oscillator where the frequency of the oscillator varies in proportion to a controlling voltage or current. For the purposes of illustrations the local oscillator of FIG. 1 is illustrated as a Voltage Controlled Oscillator (VCO) 105 whose frequency is controlled by control voltage 106 at filter capacitor 107. However, a current controlled oscillator may be substituted for VCO 105 of FIG. 1.

The output of VCO 105 may be divided in divider 115 and may be further buffered and used to drive clock tree 102. Clock tree 102 may represent the distribution of the clock signal throughout a semiconductor circuit. Due to inherent capacitances, resistances and inductances of semiconductor circuits, propagation delays may be introduced into the clock signal as it passes through clock tree 102.

PLL 100 may be controlled by feeding back the output of divider 115. However, in order to compensate for propagation delays, it may be preferable to feed back the clock signal after it has passed through clock tree 102. An output of clock tree 102 may be tapped off (and divided if necessary by divider 1401) and fed to one of the inputs 1402 of Phase Frequency Detector (PFD) 103. PFD 103 may in turn drive charge pump 114 to charge filter capacitor 107.

The other input 1403 to PFD 103 may comprise system reference clock 104 (or a divided version thereof). PLL 100 thus forms a closed loop negative feedback system. PFD 103 produces corrective signals such that the signals at the inputs 1403 & 1402 to PLL 100 are matched in frequency and phase. In other words, PLL 100 produces signals to adjust the controlling voltage 106 of VCO 105 on filter capacitor 107 such that phase and frequency of clock output (node 1402) is matched in phase and frequency with system reference clock (node 1403).

VCO 105 may have a dynamic range over which it may operate. For example, the range of VCO 105 of FIG. 1 may range from 50 MHz to 1.35 GHz. Such frequencies may correspond to upper and lower bounds of the controlling voltage, as specified in Table I.

TABLE I

| Controlling Voltage | Frequency of VCO |
| --- | --- |
| 0 | 1.35 GHz |
| Vdd-860 mV | 750 MHz |
| Vdd-700 mV | 500 MHz |
| Vdd-450 mV | 100 MHz |
| Vdd-Vtp to Vdd | 0 |

Where Vdd is supply voltage and Vtp is transistor threshold voltage. The control voltages and frequencies of Table I are used by way of illustration only and are not intended to limit the scope of the present invention in any way. Control voltage 106, for example, may be set in a reverse fashion to that of Table I (e.g., generate a high frequency at high voltage Vdd and a low frequency at low voltage or ground).

The required operating frequency of VCO 105 may be set at a nominal frequency and the useful range of operation may be approximately 500–750 MHz, in which range VCO 105 provides specified performance (i.e., the desired frequency gain, desired power supply rejection, and the like.)

PLL 100 may generally be in a locked state (e.g., at nominal frequency) where the system reference clock is at a lower frequency to accommodate the lower I/O bandwidths. For example, it may be desired to operate the system reference clock 104 at 100 MHz, clock tree 102 be at 300 MHz and VCO 105 at 600 MHz. These frequencies are provided just as an illustration and by no means limit the scope of the invention. Thus divider 1400 may be set to divide by a ratio of 1:1, divider 115 by a ratio of 1:2 and divider 1401 by a ratio of 1:3. Such ratios may enable PLL 100 to lock with inputs 1402 & 1403 to PFD 103 at 100 MHz each. VCO 105 may be bypassed by MUX 116 for dubugging purposes and a slower clock frequency supplied by system reference 104 applied to clock tree 102.

Node 1403 of PFD 103 may be fed system reference clock 104 at 100 MHz and Node 1402 a lower frequency (divided bypass clock 120 at 33.3 MHz) As a result PFD 103 may indicate, from the fed back signal from clock tree 102 that the input clock signal is too slow. PFD 103 may then drive control voltage 106 to ground which may have the effect of driving VCO 105 faster. When lower frequency bypass clock 120 is removed and VCO 105 is reconnected to clock tree 102, PLL 100 will attempt to again achieve a locked state.

However, since control voltage 106 at filter capacitor 107 is at or near ground, the output of VCO 105 may be at its maximum frequency (e.g., 1.35 GHz). If clock tree 102 cannot transmit such a high frequency signal (e.g., due to low bandwidth caused by internal capacitance, resistance and the like), the output of clock tree 102 may be undeterministic, most probably stuck at one rail or another (i.e., Vdd or ground).

PFD 103 may construe such a state as if VCO 105 were running too slow, and will feedback a signal to make VCO 105 run faster, thus further pushing control voltage 106 at filter capacitor 107 further to ground. Thus, PLL 100 may never lock properly but rather stay in a runaway condition.

Prior art systems have attempted to solve the aforementioned problems using a PLL 200 with a hyperactivity detection circuit (HDC) 290 as illustrated in FIG. 2. Such an analog HDC 290 is described, for example, in Rogers, U.S. Pat. No. 5,220,293, issued Jun. 15, 1993 entitled "High reliability phase-locked loop", assigned to the same assignee as the present application and incorporated herein by reference. In this system, the VCO happens to have a positive slope, meaning that higher control voltages correspond to higher frequencies and vice versa.

The HDC 290 comprises of a delay line 222 formed of a plurality of skewed inverters. These inverters are skewed in such a way as to propagate one edge faster than the other. For example, in the prior art circuit, the delay to propagate the rising edge from the input of the delay line to the output (termed D1) is adjusted to be much more than the delay to propagate the falling edge (termed D2).

When control voltage 206 crosses a predetermined threshold, indicating that the VCO is operating at near its maximum frequency, Schmitt trigger 265 changes state, from a 0 to a 1, generating a rising edge which is propagated along delay line 222. After a delay D1, during which time, if there occurs no activity in the clock tree which triggers resetting pulses in one shot 260, the output 252 of delay line 222 goes to a 1.

The output of delay line 222 turns on transistor 266 and after an additional small delay of inverter 250, turns off latching transistor 254. By these actions, transistor 266 turns on, discharging node 206. During the time capacitor 207 is being discharged, if latching transistor 254 is off, it does not allow any resetting pulses (should they occur) to reset delay line 222.

When capacitor 207 is discharged, and the voltage on node 206 goes below another predetermined value, Schmitt trigger 265 changes state to a 0, corresponding to a minimum operating frequency of VCO 205. The 0 at the output of Schmitt trigger 265 may be propagated along delay line 222 with a delay D2 to the gate of transistor 266, switching it off, and turning on latching transistor 254. Now VCO 205 is allowed to lock again from its lowest operating frequency.

However, if control voltage 206 is above the predetermined threshold of Schmitt trigger 265 and clock tree 202 is operating properly, then it is not desirable to reset VCO 205. Thus, one-shot 260 receives input from clock tree 202 through PFD 203. If one-shot 260 detects activity from clock tree 202 in the form of a clock transition (i.e., low to high, high to low) one-shot 260 produces pulses which drive transistor 267 which pulls the output of Schmitt trigger 265 low and clears the signal from delay line 222.

Clearing thus occurs if the rate of activity is greater than 1/(D1–D2) Hz. Here in lies a potential limitation of the prior art circuit of FIG. 2. When using the prior art HDC 290, PLL 200 cannot be made to lock if the frequency of operation clock tree 202 is less than 1/(D1–D2) Hz.

The system of FIG. 2 may operate satisfactorily in most modes of operation. However, recently, the U.S. Government has promulgated guidelines known as the EnergyStar standard for reducing computer power consumption. In the EnergyStar standard, a computer or system may switch to various levels of rest or "sleep" modes to reduce power consumption by dividing (in effect slowing) the overall system clock by a factor of 64 or some other predetermined number.

If HDC 290 is used in an EnergyStar system, activity from clock tree 202 may be slowed by a factor 64, and the delay (D1–D2) may correspondingly have to be made more than 64 cycles. Such large delay differences between propagating the rising and falling edges may be quite impossible to achieve using the prior art circuit of FIG. 2. As a result, if the delay of delay line 222 (D1–D2) is not greater than the factor of 64, HDC 290 may erroneously reset control voltage 206 of filter capacitor 207 when the system is in an energy conservation mode.

SUMMARY OF THE INVENTION

The present invention provides an HDC using a synchronous delay line clocked by the system clock. If the system clock is divided, for example, for energy saving purposes by a factor 64, the delay line tracks the division ratio. Thus, the HDC of the present invention will properly detect a runaway VCO condition, regardless of system clock speed.

In the present invention, a VCO of negative slope is used. This means lower voltages correspond to larger frequencies and vice versa, although the present invention may be applied to VCOs of both positive and negative slopes.

In the HDC of the present invention, the delay line comprises a plurality of flip-flops connected in series and clocked by the system clock (or the divided version thereof). A Schmitt trigger monitors control voltage at the filter capacitor and drives the delay line 'low' if the control voltage is below a predetermined level, which corresponds to the maximum operating frequencies of the VCO. The output of the delay line is connected to a PMOS transistor which charges the capacitor when it receives the 'low' signal from the delay line. A one shot circuit outputs a pulse to reset the flip-flops in the delay line if clock transitions are detected in the clock tree.

Thus, if system activity is present and system activity occurs at a rate faster than the propagation of the signal through the delay line, the one-shot will prevent the signal from the Schmitt trigger from reaching the charging transistor, thus preventing the HDC from resetting the VCO. If the system is in an energy saving mode, the flip-flops will be clocked at a correspondingly slower rate, as they are clocked by the system clock which may be divided for such an energy saving mode. Thus, the signal from the Schmitt trigger will be propagated through the delay line at a correspondingly slower rate any may be reset by the one-shot if activity is detected in the clock tree.

DETAILED DESCRIPTION OF THE INVENTION

Figure 1:
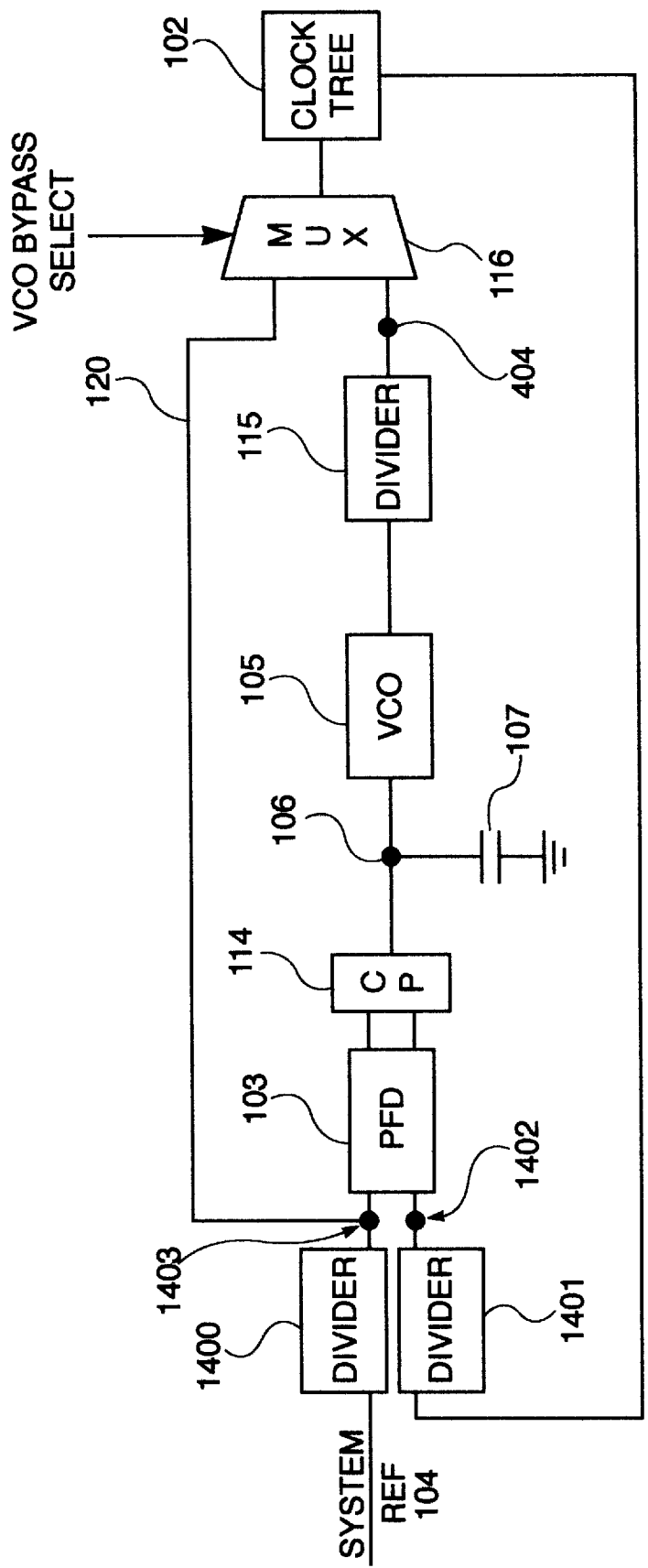
FIG. 1 is a block diagram illustrating a prior art PLL circuit.
Figure 2:
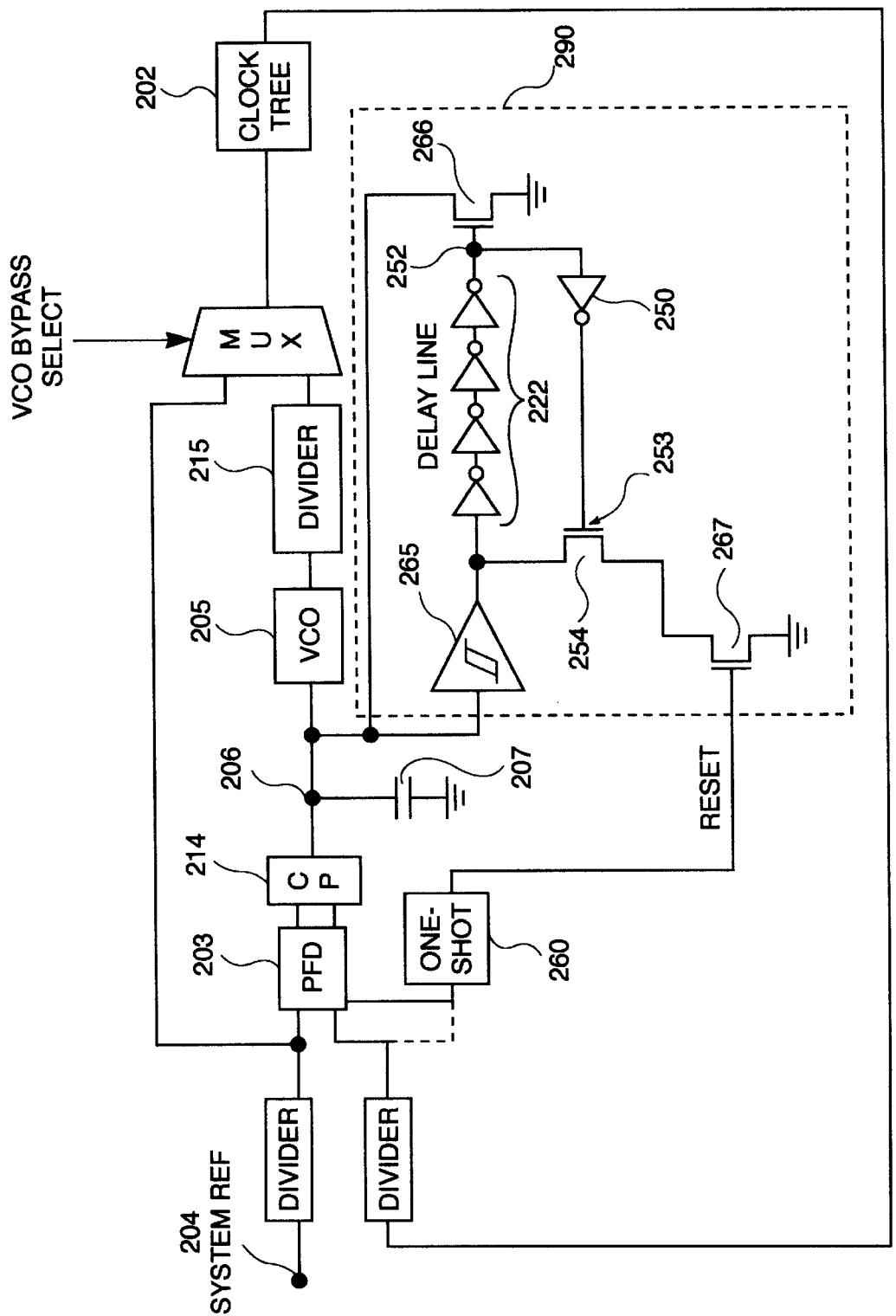
FIG. 2 is a block diagram illustrating a prior art PLL circuit with prior art HDC circuit.
Figure 3:
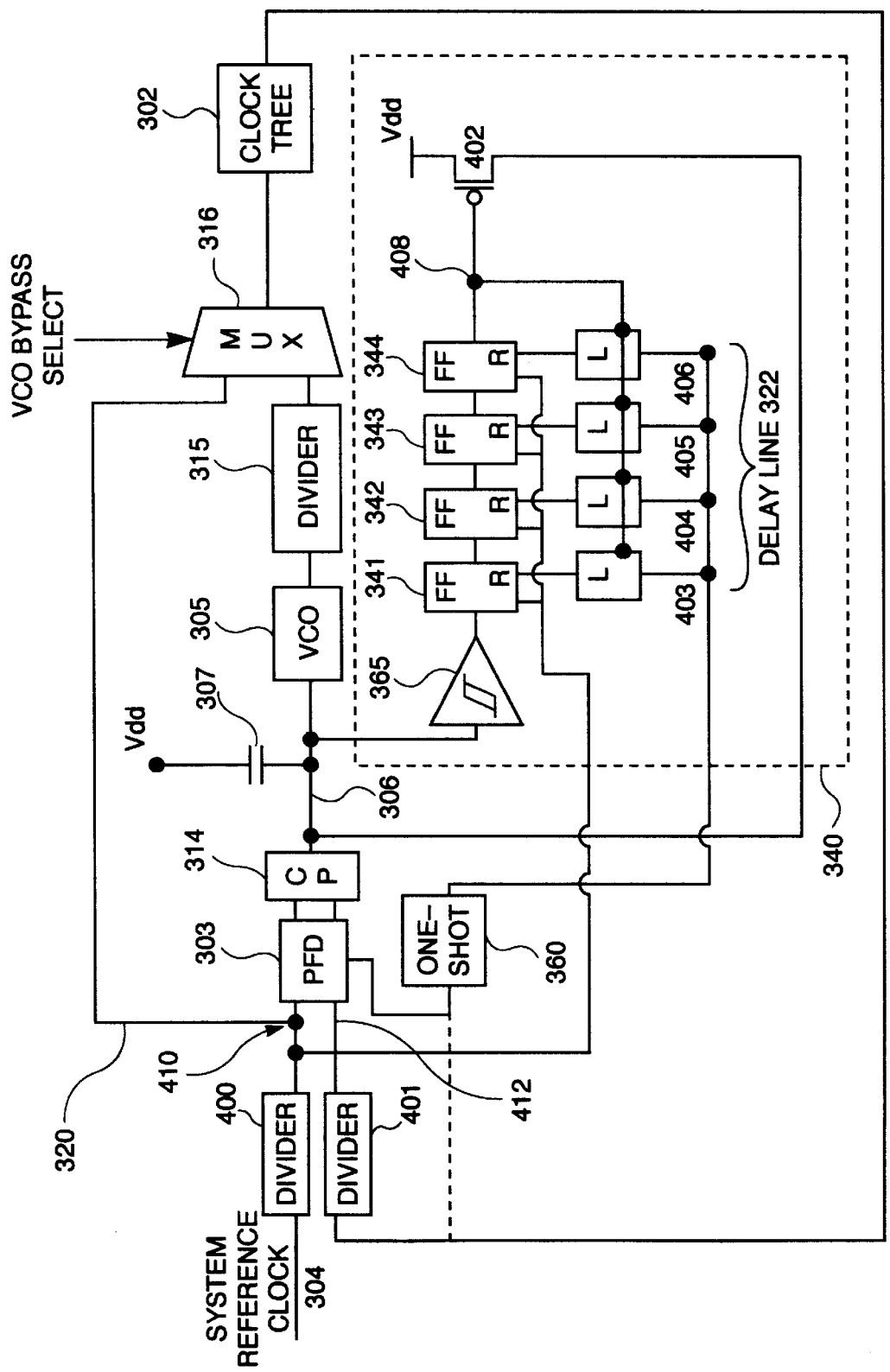
FIG. 3 is a block diagram of a PLL circuit with the HDC circuit of the present invention.

FIG. 3 is a block diagram of a PLL circuit 330 including HDC circuit 340 of the present invention. PLL circuit 330 includes filter capacitor 307 supplying control voltage 306 to control the frequency of VCO 305. PLL 330 may be controlled by feeding back the output of clock tree 302 through divider 401 to one of the inputs 412 of Phase Frequency Detector (PFD) 303. PFD 303 may in turn drive charge pump 314 to charge filter capacitor 307.

PLL 330 may generally be in a locked state (e.g., at nominal frequency), where the system reference clock might be selected at a lower frequency than VCO 305, to accommodate the lower bandwidth of the system I/O. For example, it may be desired to operate the system reference clock 304 at 100 MHz, clock tree 302 be at 300 MHz and VCO 305 at 600 MHz. These frequencies are provided just as an illustration and by no means limit the scope of the invention. Thus divider 1400 may be set to divide by a ratio of 1:1, divider 315 by a ratio of 1:2 and divider 401 by a ratio of 1:3. Such ratios may enable PLL 330 to lock with inputs 410 & 412 to PFD 303 at 100 MHz each.

It may be desired for debug purposes to bypass PLL 330 and operate clock tree 302 at a slower frequency, for example, 100 MHz. PLL 330 may then be bypassed by MUX 316 and slower clock frequency supplied by system reference clock 304 applied directly to clock tree 302. Inputs to PFD 303 may see system reference clock 304 which has frequency of 100 MHz at node 410 and a lower frequency clock which has frequency 33.3 MHz at node 412 (the bypass clock divided by divider 401). As a result PFD 303 may indicate, from the fed back signal from clock tree 302 that the VCO signal is too slow.

PFD 303 may then drive control voltage 306 to ground which may have the effect of driving VCO 305 faster. When lower frequency bypass clock 320 is removed and VCO 305 is reconnected to clock tree 302, PLL 330 may attempt to again achieve a locked state. Since the filter voltage 307 happens to be at ground, which corresponds to the maximum operating voltage of the VCO, the VCC will be running at its maximum operating frequency, for example, 1.35 GHz.

Clock tree 302 might not be able to transmit such a high frequency, and therefore the input to the PFD 412 might not see this signal. PFD 303 will interpret such actions as the VCO 305 running too slowly and act in a way to make it run faster, pushing node 306 further to ground. Thus PLL 330 might never achieve lock at all.

HDC 340 includes Schmitt trigger 365 which is connected to filter capacitor 307 to sample controL voltage 306. When control voltage 306 at filter capacitor 307 crosses below a predetermined voltage which corresponds to a maximum operating frequency of VCO 305, Schmitt trigger 365 may output a '0' which may be propagated along delay line 322. The output of delay line 322 may in turn drive PMOS transistor 402. PMOS Transistor 402, upon receiving the '0', will turn on, charging filter capacitor 307. Thus increasing control voltage 306 and reducing the frequency of VCO 305.

While PMOS transistor 402 is charging filter capacitor 307, it is desirable that filter capacitor 307 be fully charged and VCO frequency be reduced to the minimum, before switching off PMOS transistor 402. For this purpose, latches 403–406 are inserted, such that when signal 408 is low (charging filter capacitor 307), latches 403–406 disconnect the output of one shot 360 to the resets of delay line 322. Latches 403–406 are so-called "transparent" latches which will normally pass through a signal from input to output. However, when signal at node 408 goes low, transparent latches 403–406 become opaque, interrupting any reset signals to flip-flops 341–342. After filter capacitor 307 has been fully discharged and the signal at node 408 turned high (to turn off transistor 402) latches 403–406 enable one shot 360 to reset delay line 322 again. At this stage, VCO 305 might be operating at its lowest frequency and PLL 330 allowed to lock.

One-shot 360 may monitor the output of clock tree 302 for activity (i.e., high to low or low to high transitions). If there is activity, then it is presumed that PLL 330 is operating properly and is either in lock or will lock properly. If there is no activity for the duration of time required to propagate the signal along the delay line (one or more clock cycles of system reference clock 304) even though VCO 305 is running near or at its maximum design frequency, then it is presumed that clock tree 302 has been overwhelmed. If clock tree 302 has been overwhelmed, filter capacitor 307 is reset to a control voltage 306 corresponding to the minimum operating frequency of VCO 305 and PLL 330 is allowed to lock from that point.

However, if clock tree 302 has not been overwhelmed, then it is not desirable to reset control voltage 305. The output of one-shot 360 thus resets delay line 322, preventing transistor 402 from being turned on and control voltage 306 from being reset. Delay line 322 comprises a plurality of flip-flops 341, 342, 343, 344, each driven by system reference clock 304. As flip-flops 341, 342, 343, 344 are driven by system reference clock 304, the length of delay produced by delay line 322 will always be proportional to the frequency of system reference clock 304.

In the example illustrated in FIG. 3, four flip-flops 341, 342, 343, 344 comprise delay line 322, and thus the amount of delay will be equal to four clock cycles of system reference clock 304. However, other numbers of flip-flops 341, 342, 343, 344 may be utilized to provide different levels of delay. Moreover, other types of delay elements other than flip-flops may be used, so long as the delay elements are synchronous with system reference clock 304

Moreover, although illustrated herein as applicable to an oscillator circuit, the hyperactivity detection circuit of the present invention may also be applied to other types of circuitry where a runaway or stuck condition may occur and an accurate reset of such a condition may be required. Although illustrated herein in terms of circuit elements, the apparatus of the present may also be implemented in software, firmware or in a programmable logic array or the like.

Thus, HDC 340 of the present invention may accurately and reliably detect an oscillator runaway condition, regardless of system clock frequency, as HDC 340 is controlled by system reference clock 304. While the preferred embodiment and various alternative embodiments of the invention have been disclosed and described in detail herein, it may be apparent to those skilled in the art that various changes in form and detail may be made therein without departing from the spirit and scope thereof.

What is claimed is:

1. A hyperactivity detection apparatus for detecting and correcting an abnormal condition in a circuit, said hyperactivity detection apparatus comprising:

a detector for detecting a first signal characteristic of the abnormal condition and outputting a second signal indicating the first signal has been detected;

a synchronous delay line coupled to said detector and synchronized to a system clock for receiving the second signal and delaying the second signal a predetermined number of cycles of the system clock; and a reset activator coupled to the synchronous delay line and the circuit, for receiving the second signal from said synchronous delay line and resetting the circuit in response to the second signal.

2. The hyperactivity detection apparatus of claim 1, further comprising:

an activity detector, coupled to the circuit and said synchronous delay line, for detecting activity in the circuit and resetting said synchronous delay line in response to a detection of activity in the circuit.

3. The hyperactivity detection apparatus of claim 2, wherein said synchronous delay line comprises a plurality of flip-flops connected in series and clocked by the system clock.

4. The hyperactivity detection apparatus of claim 3, wherein said activity detector resets each of said plurality of flip-flops in response to a detection of activity in the circuit.

5. The hyperactivity detection apparatus of claim 4, wherein said synchronous delay line further comprises a plurality of latches each coupled to a corresponding reset line of a corresponding flip-flop, said latches coupled to said activity detector and an output of said synchronous delay line, wherein said plurality of latches disconnect corresponding reset lines of corresponding flip-flops when said circuit is being reset.

6. The hyperactivity detection apparatus of claim 5, wherein the first signal comprises a control voltage and said detector comprises a Schmitt trigger for monitoring the control voltage and outputting the second signal if the control voltage passes a predetermined level.

7. The hyperactivity detection apparatus of claim 6, wherein said activity detector comprises a monostable multivibrator coupled to detect clocking activity in the circuit and outputting a pulse in response to detected clocking activity.

8. The hyperactivity detection apparatus of claim 7, wherein said reset activator comprises a transistor coupled to a predetermined voltage and the circuit for resetting the control voltage to a reset level.

9. The hyperactivity detection apparatus of claim 8, wherein the circuit comprises an oscillator circuit, the control voltage comprises a filter capacitor control voltage, and the clocking activity comprises an output of the oscillator as fed through a clock tree.

10. A hyperactivity detection circuit for detecting and correcting a runaway condition in an oscillator circuit, said hyperactivity detection circuit comprising:

a Schmitt trigger for monitoring filter capacitor control voltage of the oscillator circuit and outputting a signal indicating that the filter capacitor control voltage has passed a predetermined level indicating the oscillator is operating above a predetermined frequency;

a synchronous delay line coupled to said detector and synchronized to a system clock for receiving the signal and delaying the signal a predetermined number of cycles of the system clock; and a reset activator coupled to the synchronous delay line and the circuit, for receiving the signal from said synchronous delay line and resetting the circuit in response to the signal.

11. The hyperactivity detection circuit of claim 10, further comprising:

an activity detector, coupled to a clock tree coupled to the oscillator and said synchronous delay line, for detecting clocking in the clock tree and resetting said synchronous delay line in response to a detection of clocking activity in the clock tree.

12. The hyperactivity detection circuit of claim 11, wherein said synchronous delay line comprises a plurality of flip-flops connected in series and clocked by the system clock.

13. The hyperactivity detection circuit of claim 12, wherein said delay line further comprises a plurality of latches each coupled to a corresponding reset line of a corresponding flip-flop, said latches coupled to said activity detector and an output of said synchronous delay line, wherein said plurality of latches disconnect corresponding reset lines of corresponding flip-flops when said circuit is being reset.

14. The hyperactivity detection circuit of claim 13, wherein said activity detector resets each of said plurality of flip-flops in response to a detection of clocking activity in the clock tree.

15. The hyperactivity detection circuit of claim 14, wherein said activity detector comprises a monostable multivibrator coupled to detect clocking activity in the clock tree and outputting a pulse in response to detected clocking activity.

16. The hyperactivity detection circuit of claim 15, wherein said reset activator comprises a transistor coupled to a predetermined voltage and the oscillator circuit for resetting the filter capacitor control voltage to a reset level corresponding to a lower operating frequency of the oscillator.

* * * * *